(12) United States Patent
Bittner

(10) Patent No.: US 7,408,350 B2
(45) Date of Patent: Aug. 5, 2008

(54) SYSTEM FOR MONITORING A QUENCH TUBE OF A SUPERCONDUCTING MAGNET IN AN MRT APPARATUS

(75) Inventor: Gerhard Bittner, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 143 days.

(21) Appl. No.: 11/516,223

(22) Filed: Sep. 5, 2006

(65) Prior Publication Data

US 2007/0126424 A1 Jun. 7, 2007

(30) Foreign Application Priority Data

Sep. 5, 2005 (DE) .................. 10 2005 042 112

(51) Int. Cl.
*G01V 3/00* (2006.01)

(52) U.S. Cl. ....................................... 324/318

(58) Field of Classification Search .................. 324/318
See application file for complete search history.

(56) References Cited

U.S. PATENT DOCUMENTS 5,657,634 A 8/1997 Woods

FOREIGN PATENT DOCUMENTS

DE 103 41 426 A1 4/2005

*Primary Examiner*—Brij B. Shrivastav
*Assistant Examiner*—Megann E Vaughn
(74) *Attorney, Agent, or Firm*—Schiff Hardin LLP

(57) ABSTRACT

A system for monitoring a quench tube of a superconducting magnet in an MRT apparatus has an illumination unit and at least one image acquisition unit arranged inside the quench tube. Images acquired by the image acquisition unit are supplied to a monitoring location for viewing.

15 Claims, 1 Drawing Sheet

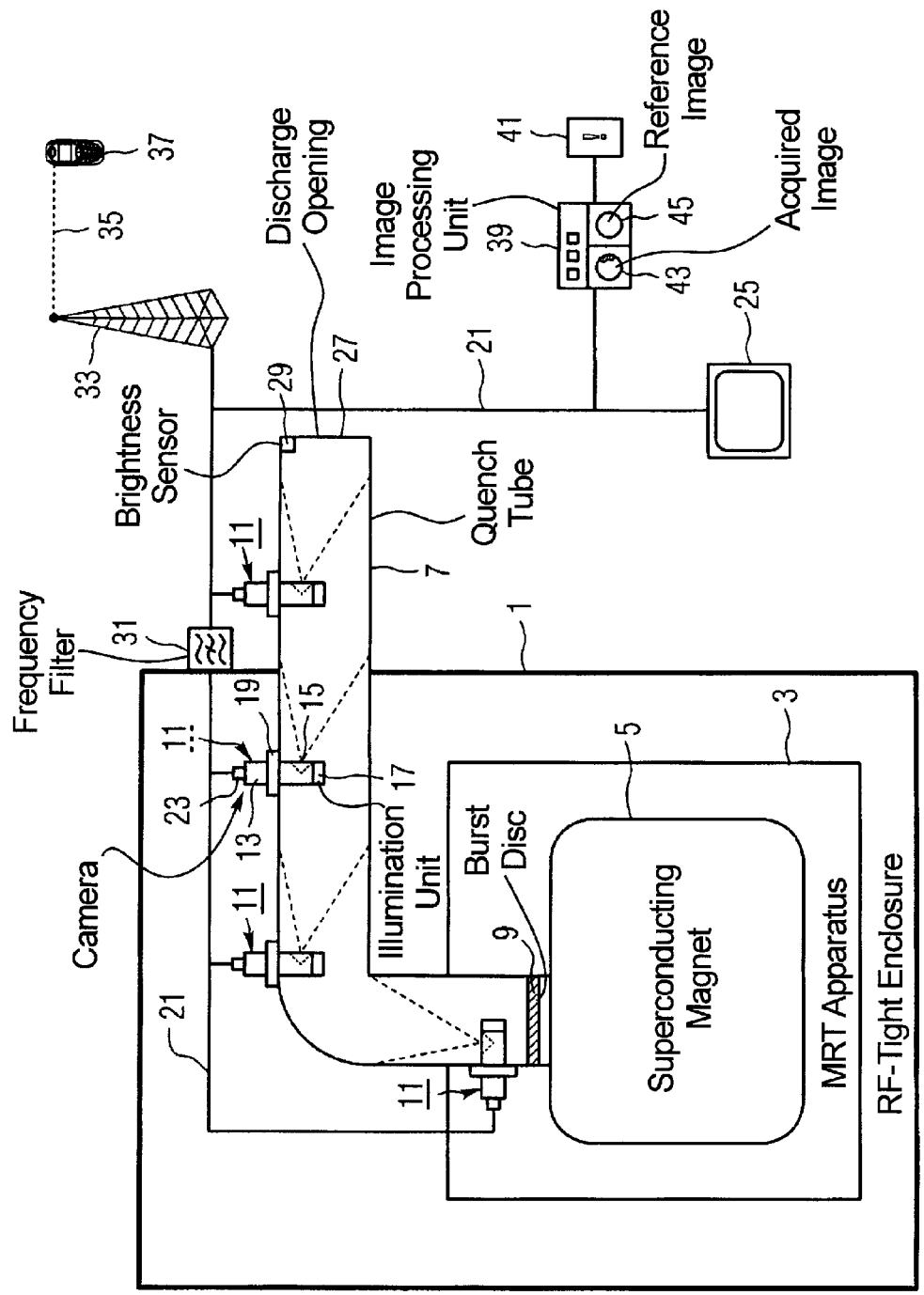

SYSTEM FOR MONITORING A QUENCH TUBE OF A SUPERCONDUCTING MAGNET IN AN MRT APPARATUS

BACKGROUND OF THE INVENTION

1. Field of the Invention

The present invention concerns a system for monitoring a quench tube of a superconducting magnet in a magnetic resonance tomography apparatus (MRT apparatus).

2. Description of the Prior Art

In medical imaging MRT apparatuses have increasingly gained importance in recent years. In order produce images with such apparatuses, typically different magnetic fields that are matched to one another in terms of spatial and temporal characteristics are combined with one another. One of these magnetic fields is a static magnetic field with a high field strength of typically 1.5 to 3 Tesla. In order to generate such high field strengths, usually superconducting magnets are used with conductor wires formed by a superconducting material, for example a niobium-titanium alloy. The cooling of the conductor wires and the maintenance of the superconducting state ensue with liquid helium.

In a superconducting magnet on rare occasions an event known as a quench occurs. Various causes can lead to the situation that the superconducting state of the conductor wire changing into the normally-conductive state. The resulting severe heating of the conductor wire leads to a sudden vaporization of the liquid helium. In order to prevent damage to the apparatus, the large volume of helium gas suddenly created must be quickly directed away from the apparatus. In MRT apparatuses with a superconducting magnet this ensues by means of what is known as a quench tube through which the helium gas is conducted away from the apparatus into the ambient atmosphere. The diameter of such a tube is calculated dependent on its length and its curvatures and is typically 20 to 40 cm. The quench tube can never be blocked or leaky during the long-term operation of an MRT apparatus, otherwise the housing of the MRT apparatus could be damaged (even an explosion) given a quench or the building could be flooded with helium (possible asphyxiation danger).

A ventilation tube arrangement for a superconducting magnet system is known from DE 696 34 719 T2, which arrangement also serves as a flow path in the case of a magnet quench.

A quench tube can be damaged by multiple causes. Animals or plants can penetrate into the quench tube via the opening discharge to the atmosphere or discharge the opening. Also, water can accumulate in the quench tube over the course of many years of operation, for example as condensation water that forms after tanking up the magnet reservoir with liquid helium (the cold helium exhaust thereby created is directed through the quench tube) or in the case of disadvantageous weather conditions, or as rainwater that can penetrate the discharge opening in the case of faulty mounting. The quench tube can thereby be damaged. Upon a quench the water located in the quench tube represents a significant problem since it can be frozen by the very cold helium gas and thus block or even burst the tube.

Quench tubes are regularly checked by an overview during maintenance tasks. Since an intact quench tube is an important, safety-relevant component but not an operationally-relevant component of an MRT apparatus, it can occur that the quench tube is only insufficiently checked in the maintenance, particularly since the quench tube is often not accessible over its entire length. Possible blockages or damages that are caused by penetrating foreign bodies can easily be overlooked, or not detected at all if maintenance intervals that are too long.

A method for space monitoring and a space monitoring system for traffic spaces (in particular tunnel regions) for situation recognition by means of evaluation of video signals is known from DE 103 41 426 A1. The system includes illumination units and image acquisition units (CCD cameras).

SUMMARY OF THE INVENTION

An object of the present invention is to provide a device for simple and time-saving monitoring of a quench tube in an MRT apparatus.

The object is inventively achieved by a device for monitoring a quench tube in an MRT apparatus having at least one illumination unit and at least one image acquisition unit arranged inside a quench tube. Images of the inside of the quench tube can be produced in a simple manner via such a device, with which images the intactness and permeability (tightness against leaks) of the tube can be monitored in a simple manner. The number of the image acquisition units and illumination units used conforms to the size, length and bends (curves) of the quench tube.

In a preferred embodiment, at least one of the image acquisition units is mounted in the quench tube such that the discharge opening can be observed from the inside. Both the discharge opening and the immediate environment of the discharge opening thus can be monitored. This environment is (depending on the structural mounting) often a cause of a non-functional quench tube since it is, for example, displaced by plants or nesting animals.

In a simple embodiment, at least one image acquisition unit and at least one illumination unit are arranged in a housing. Such a housing can be permanently attached in a quench tube without large structural changes, for example via a bore hole. The part of the housing that is located inside the quench tube contains the at least one image acquisition unit and the at least one illumination unit. The bore hole with the housing is sealed by a sealant. Already-installed quench tubes can be retrofitted with such a device. The number of such housings that are typically mounted in a quench tube conforms to the size, length and turns of the quench tube and the viewable region that can be seen by the illumination and image acquisition units located in the housing. In a simple embodiment, the housings with the image acquisition units can be fashioned with a camera (similar to mobile telephones). Acquisition units designed in such a manner can be externally activated for image acquisition.

A mounting flange with which the bore hole is sealed is attached around the housing. By this design a quench tube can be retrofitted with monitoring units in a simple manner. Furthermore, housings with a defective component can be exchanged in a simple manner.

The illumination unit can be cost-effectively designed as a light-emitting diode that is simple to maintain due to its long lifespan.

In one embodiment electrical lines (conductors) are connected to the image acquisition units via a plug connection. The electrical line supplies the image acquisition units with energy and/or relays images acquired by the image acquisition units. The plug connection can be mounted such that the electrical line is connected from outside the quench tube to the housing that contains the image acquisition unit. The plug connection and with it the electrical line thus are located in an environment that does not significantly change in terms of temperature upon a quench, so that these components are not damaged upon a quench.

The image acquisition units can be connected with a frequency filter. The frequency filter can thereby be attached in the electrical line or can be in the plug connection, for example. The frequency filter prevents electromagnetic radio-frequency radiation from reaching the proximity of the MRT apparatus via the electrical lines and thus disrupt the apparatus. The frequency filter therefore preferably blocks the operating frequency of the MRT apparatus.

In an embodiment, the image acquisition units are connected with an image display unit (for example with a monitor) such that the images that are acquired by various image acquisition units can be shown on the monitor. An observer thus can switch back and forth between the individual images, such that for regular routine monitoring the entire quench tube is inspected in a fast manner.

In another embodiment the image acquisition units are connected with a distribution unit from which the data can be transferred via a network connection and/or radio connection to an image display unit. The images can also be transferred to an image display apparatus that is not necessarily located on site but rather (for example in the maintenance center of a company) is charged with the maintenance of various MRT apparatuses. The image display unit can also be fashioned as a portable device such as, for example, a multimedia-capable portable mobile telephone.

In an embodiment wherein the maintenance of the quench tube can for the most part be performed automatically, the image acquisition units are connected with an image processing unit. The image processing unit is fashioned such that it compares an image acquired by one of the image acquisition units with a reference image and generates a signal if the difference between the acquired image and the reference image lies outside of a tolerance range. The signal can trigger a warning signal on site so that the user is informed of the problem, or can trigger an alarm in a maintenance center that does not necessarily have to be located on site.

The comparison of an acquired image with a reference image can ensue by means of various known algorithms. For example, the two images can be subtracted from one another or can be correlated with one another. A pattern recognition algorithm also can be applied to both images such that the images are compared using the detected patterns.

A brightness sensor can be arranged at the discharge opening of the quench tube. Since the discharge opening often leads to the ambient atmosphere, the brightness in the environment of the discharge opening can change depending on the time of day. Via the sensor the brightness can be measured and thus, for example, a reference image can be selected that has been produced at the same brightness. The tolerance range of the image comparison algorithm can also be expanded or limited depending on the brightness value.

DESCRIPTION OF THE DRAWING

The single FIGURE schematically illustrates a magnetic resonance tomography apparatus having a quench tube, and a system in accordance with the present invention for monitoring the quenched tube.

DESCRIPTION OF THE PREFERRED EMBODIMENTS

The drawing schematically shows an RF-tight room or enclosure 1 for radio-frequency radiation, in which an MRT apparatus 3 is located. A superconducting magnet 5 cooled with helium is a component of the MRT apparatus 3. Upon a quench of the superconducting magnet 5, i.e. in the case of a sudden transition from the superconducting state to the normally-conductive state, a substantial heating of the magnet 5 occurs. This causes the liquid helium used for cooling to be abruptly converted into the gaseous state, which results in an extremely rapid volume expansion of the now-gaseous helium. So that neither people nor objects are damaged in such an incident, a quench tube 7 that attaches to the reservoir with liquid helium is a necessary component of the system in an MRT apparatus 3. The quench tube 7 is dimensioned such that large quantities of gaseous helium can be directed through the quench tube 7. A burst (rupture) disc 9 or a valve is typically located at the beginning of the tube 7 (near the magnet 5) in order to normally separate the liquid helium from the environment. Upon a quench, the burst disc 9 breaks or the valve opens due to the sudden pressure increase and the gas can escape via the quench tube 7.

For this purpose it is necessary that the quench tube 7 be intact and freely passable. In order to prevent, in a simple manner, the situation of the quench tube 7 being blocked or damaged by foreign bodies (for example by penetrating animals or by water), a number of cameras 11 are mounted in the quench tube 7 so that all regions of the quench tube 7 can be viewed. In the example in the drawing a camera 11 is located both before and after the bend of the quench tube 7. A series of cameras 11 is also mounted along the straight part so that the quench tube can be observed along its entire length. The discharge opening 27 is also observed from the inside by a camera 11, since here the danger particularly exists of nesting animals or plants displacing or blocking the discharge opening 27.

In addition to an image acquisition unit 15, the housing 13 of such a camera 11 also contains an illumination unit 17 so that no additional illumination of the quench tube is necessary. In a simple embodiment of the invention, the image acquisition unit can be a CCD sensor with adapted optics. In a simple and cost-effective design the illumination unit 17 is formed by a number of light-emitting diodes.

Since the camera 11 can become defective in the course of use and in particular can be destroyed by the escaping cold helium given a quench, they are mounted such that they can be exchanged in a simple manner. For this purpose bore holes are provided in the quench tube 7, via which bore holes the image-acquisition part of the camera 11 can be inserted into the interior of the quench tube. The capability of exchanging the camera 11 and at the same time the sealing of the bore hole are accomplished by a mounting flange 19 that is attached around each camera 11.

The image signal is conducted to a monitor 25 via feed lines 21 that are connected with each camera 11 via a plug connection 23 to the part of the camera 11 located outside of the bore hole. At the monitor 25, the entire quench tube 7 can be inspected in a quick manner at regular time intervals. The plug connection 23 allows the camera 11 to be exchangeable and also ensures that parts of the feed line 21 will not be destroyed by the cold helium gas upon a quench, so that a replacement of the camera 11 can be performed simply and quickly. The feed lines 21 are provided with a frequency filter 31 so that the radio-frequency system of the MRT apparatus 3 is not disrupted from the outside. Switching between the individual images that are acquired by the various cameras 11 is advantageously implemented using an appropriately connected switch.

A further possibility is to transfer (forward) the images to a maintenance center that does not necessarily have to be located on site. This can occur by the image data being conducted to a distribution unit 33 via the feed lines 21. From the distribution unit 33 the image data can be transferred via a radio line (for example via a UMTS connection) to a permanently-installed monitor or to a mobile display device (for example a multimedia-capable mobile telephone 37). The party that is charged with maintenance of the MRT apparatus 3 can thus inspect the quench tube 7 in a fast and simple manner without having to be on site.

The examination of the quench tube 7, in particular of the part of the quench tube 7 that is located in the enclosure 1 together with the MRT apparatus 3, does not occur during the operation of the MRT apparatus 3, in order not to disturb the sensitive MRT data acquisition by the operation of the camera 11. Since the examination of the quench tube 7 can be implemented very quickly, it is possible, for example, to implement this examination before beginning the MRI data acquisition.

In an embodiment an image processing unit 39 is located downstream from the camera. This image processing unit 39 compares the acquired images 43 with previously-produced reference images 45 in order to determine possible changes in the quench tube 7. If an unacceptable deviation is established between an image 43 and a reference image 45, the image processing unit generates a signal 41 that indicates a possible problem.

The discharge opening 27 that, due to its access to the ambient atmosphere, can easily be displaced, for example, by nesting animals or plants, is also advantageously monitored form inside the quench tube 7. The discharge opening 27 can be shielded from daylight so that incident daylight does not influence the acquired image. Alternatively, a brightness sensor 29 can be mounted at the discharge opening 27 via which the incident brightness is measured. With the measured brightness value, the tolerance range for the image comparison can be adapted so that the tolerance range is expanded, and in fact dependent on both the brightness at which the image 43 and the brightness at which the reference image 45 were produced. Alternatively, the acquired image 45 can be compared with a suitable reference image 45 that was acquired at a comparable brightness.

Due to the possibility of a false alarm, the image processing unit 39 is not operated immediately after tanking up the system with helium, because plumes of vapor can arise due to the comparably significant cooling in the quench tube 7, as well as the glossiness of the walls due to the condensed water could trigger a false alarm.

Although modifications and changes may be suggested by those skilled in the art, it is the intention of the inventor to embody within the patent warranted hereon all changes and modifications as reasonably and properly come within the scope of his contribution to the art.

I claim as my invention:

1. A system for monitoring a quench tube of a superconducting magnet, comprising:
   a device insertable into an interior of a quench tube of a superconducting magnet comprising an illumination unit that illuminates at least a portion of the interior of the quench tube and an image acquisition unit that acquires an image of at least a portion of the interior of the quench tube; and
   a display located outside of said quench tube in communication with the image acquisition unit, at which the image acquired by the image acquisition unit is presented for viewing.

2. A system as claimed in claim 1 wherein said quench tube has a discharge opening, and wherein said image acquisition unit has a field of view and is located in said interior of said quench tube with said discharge opening in said field of view.

3. A system as claimed in claim 1 wherein said device comprises a housing, containing said illumination unit and said image acquisition unit fixedly mounted with at least a portion of said housing inside said quench tube.

4. A system as claimed in claim 3 wherein said quench tube has a bore therein, and wherein said housing is inserted in said bore, and comprising a sealing that seals a junction between said housing and said bore.

5. A system as claimed in claim 4 wherein said sealing comprises a mounting flange disposed around said housing.

6. A system as claimed in claim 1 wherein said illumination unit comprises at least one light-emitting diode.

7. A system as claimed in claim 1 comprising an electrical conductor connected to said image acquisition unit via a plug connection.

8. A system as claimed in claim 7 comprising a frequency filter connected to said image acquisition unit.

9. A system as claimed in claim 8 wherein said superconducting magnet is a component of a magnetic resonance tomography apparatus that operates at an operating frequency, and wherein said frequency filter is a filter that blocks said operating frequency.

10. A system as claimed in claim 7 wherein said image acquisition unit is connected to said display unit via said electrical conductor.

11. A system as claimed in claim 1 comprising a distribution unit in communication with said image acquisition unit, said distribution unit being in communication with said image display unit via a communication link selected from the group consisting of a network connection and a radio connection.

12. A system as claimed in claim 1 comprising an image processing unit in communication with said image acquisition unit wherein the image acquired by said image acquisition unit is compared with a reference image, said image processing unit generating an output signal if a difference between said acquired image and said reference image is outside of a tolerance range.

13. A system as claimed in claim 12 wherein said quench tube has a discharge opening, and wherein said image acquisition unit has a field of view and is located in said quench tube at a position so that said discharge opening is within said field of view, and comprising a brightness sensor that detects a brightness level at said discharge opening and supplies a signal to said image processing unit to adapt said tolerance range dependent on the brightness detected by said brightness sensor.

14. A system as claimed in claim 1 wherein said device is a first device, and comprising a plurality of additional devices, identical to said first device, respectively positioned along a length of said quench tube.

15. A system as claimed in claim 14 wherein each of said first device and said additional devices has a field of view, and wherein said first device and said additional devices are positioned along the length of said quench tube so that the respective fields of view, in combination, cover an entirety of said length of said quench tube.

* * * * *